United States Patent
Li

(10) Patent No.: US 6,599,031 B2
(45) Date of Patent: Jul. 29, 2003

(54) OPTICAL/ELECTRICAL INTERCONNECTS AND PACKAGE FOR HIGH SPEED SIGNALING

(75) Inventor: Yuan-Liang Li, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/949,926

(22) Filed: Sep. 12, 2001

(65) Prior Publication Data

US 2003/0048998 A1 Mar. 13, 2003

(51) Int. Cl.⁷ .................................. G02B 6/12
(52) U.S. Cl. .................. 385/88; 385/89; 385/92; 385/94; 385/14
(58) Field of Search ................ 385/14, 88–94

(56) References Cited

U.S. PATENT DOCUMENTS

| | | | |
|---|---|---|---|
| 3,943,021 A | 3/1976 | Lindsey ................ 385/14 X |
| 4,422,088 A | * 12/1983 | Gfeller ................ 385/37 |
| 5,011,248 A | * 4/1991 | Taki ................ 385/14 |
| 5,054,870 A | 10/1991 | Lösch et al. ................ 385/14 |
| 5,521,992 A | 5/1996 | Chun et al. ................ 385/14 |
| 5,818,990 A | * 10/1998 | Steijer et al. ................ 385/49 |
| 5,902,435 A | 5/1999 | Meis et al. ................ 156/230 |
| 6,005,991 A | 12/1999 | Knasel ................ 385/14 |
| 6,233,376 B1 | 5/2001 | Updegrove ................ 385/14 |
| 6,252,252 B1 | 6/2001 | Kunii et al. ................ 257/81 |
| 6,427,034 B1 | 7/2002 | Meis et al. ................ 385/14 |
| 2002/0061174 A1 | 5/2002 | Hurt et al. ................ 385/92 |

FOREIGN PATENT DOCUMENTS

| | | | | |
|---|---|---|---|---|
| DE | 42 42 823 A1 | 4/1994 | ........... 385/14 X |
| DE | 199 47 889 A1 | 5/2001 | ........... 385/14 X |
| FR | 2 690 304 A1 | 10/1993 | ........... 385/14 X |
| FR | 2 795 872 A1 | 1/2001 | ........... 385/14 X |
| WO | WO 01/54321 A1 | 7/2001 | ........... 385/14 X |

* cited by examiner

Primary Examiner—Hung N. Ngo
(74) Attorney, Agent, or Firm—Antonelli, Terry, Stout & Kraus, LLP

(57) ABSTRACT

An opto-electrical printed circuit board (PCB) and compatible opto-electrical package. The PCB includes a base material, one or more optical fibers imbedded in or on top of the base material, and one or more transparent substrates imbedded in or on top of the base material covering the optical fibers. The optical fibers provide a high speed interconnect between two or more electronic devices attached to the PCB. The electronic devices interface to the optical fibers through the transparent substrate. The opto-electrical package includes a base material, an optical receiver and an optical transmitter attached to the bottom side of the base material, an encapsulating polymer that covers the optical receiver and optical transmitter, and one or more power and ground connection points attached to the bottom side of the base material.

22 Claims, 5 Drawing Sheets

OPTICAL/ELECTRICAL INTERCONNECTS AND PACKAGE FOR HIGH SPEED SIGNALING

BACKGROUND

1. Field of the Invention

This invention relates to microelectronic die packages and interconnects on a printed circuit board, and more specifically to optical interconnects and packaging for high speed signaling on a printed circuit board.

2. Background Information

Most electronic units include a printed circuit board with electronic packages attached to the printed circuit boards. These electronic packages contain one or more microelectronic dies or other circuitry. The packages are plugged into or otherwise electrically attached to sockets. These sockets are electrically attached to the printed circuit board and connect the microelectronic die or electronic circuits in the package to wiring traces on or embedded in the printed circuit board. The wiring traces provide the interconnections between the microelectronic dies or circuitry on the packages.

Currently, electronic units are operating at faster and faster speeds. As the frequency/operating speed of devices in these units is increased, the wiring traces on existing printed circuit boards (usually composed of copper metal) exhibit high conduction losses. This conduction loss results in attenuated or distorted signals at higher frequencies. Further, the dielectric loss gets worse at higher frequencies.

Increasing the width of the wiring traces is one current solution to the problem of high conduction loss. However, increasing the width of wiring traces reduces the signal routing capability on the printed circuit board (since the wider traces take up more board space). Moreover, wider wiring traces also result in higher dielectric loss. Increasing the dielectric thickness or replacing the dielectric material with new material is one current solution to high dielectric loss. However, increasing the dielectric thickness results in higher cost. Further, developing new material to replace the existing dielectric material is also extremely costly.

Therefore a need exists for a printed circuit board with interconnects and packaging for high speed signaling.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein.

DETAILED DESCRIPTION

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The present invention relates to optical interconnects and packaging for high speed signaling on a printed circuit board (PCB). According to the present invention, electronic devices that require high speed signaling are interconnected on a printed circuit board via optical fibers. These electronic devices are housed in packaging that supports the transfer of signals via optical fibers. Optical interconnects on a printed circuit board according to the present invention provide lossless signaling paths from one electronic device (i.e., microelectronic die) to another electronic device.

Figure 1:
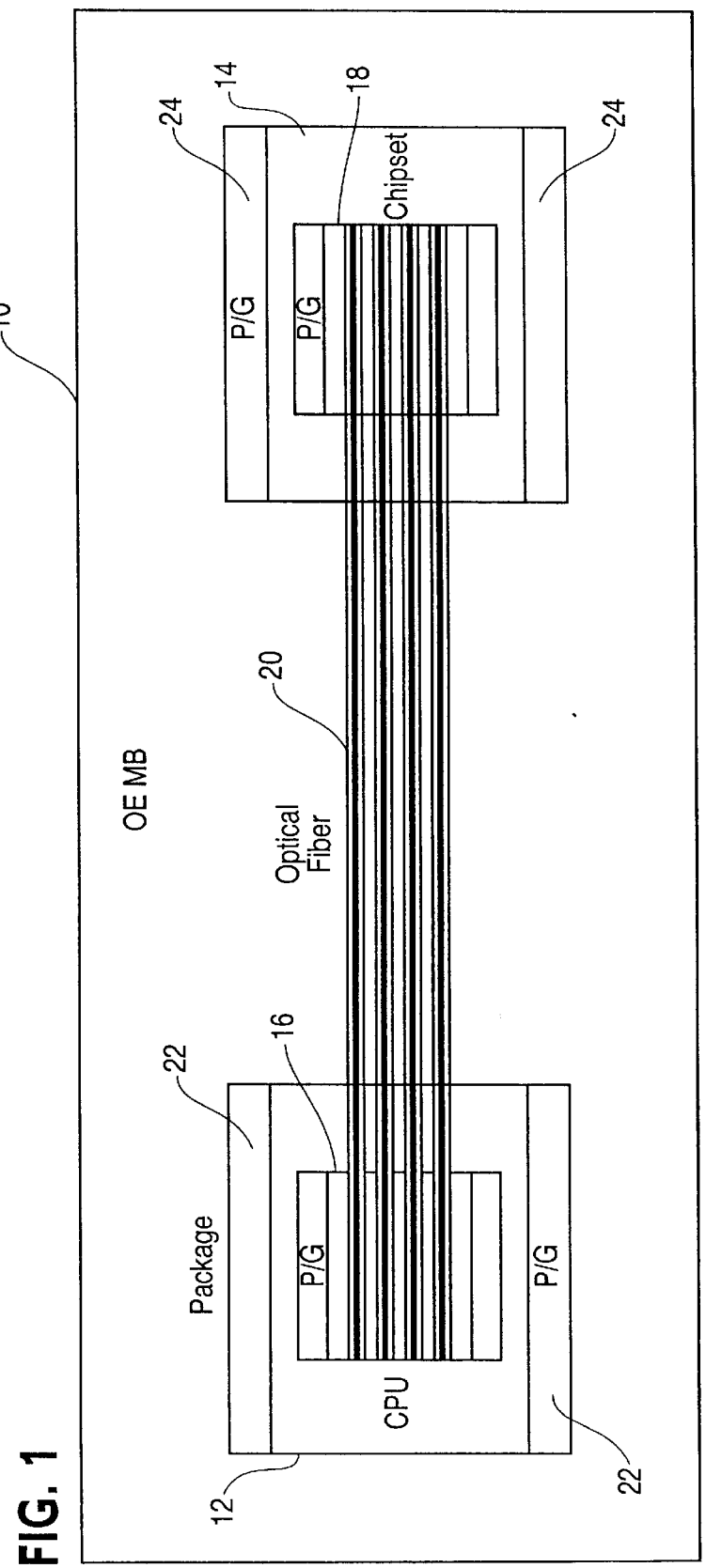
FIG. 1 is a diagram of an opto-electrical printed circuit board according to an example embodiment of the present invention.

FIG. 1 shows a diagram of an opto-electrical printed circuit board according to an example embodiment of the present invention. Opto-electrical printed circuit board 10 contains a first microelectronic die 16, and a second microelectronic die 18 that are housed on a first package 12 and a second package 14, respectively. Packages 12 and 14 are attached to opto-electrical printed circuit board 10. The two electronic devices (microelectronic dies 16 and 18) are interconnected by optical fibers 20 that provide a high speed interconnection between the two microelectronic dies.

A first area 22 and second area 24 on packages 12 and 14, respectively, represent areas where power and ground conductors (e.g., pins) reside. Although two areas per package are shown, a package may contain power and ground connections on one side (i.e., one area), two sides, three sides, or all sides of the package and still be within the spirit and scope of the present invention. The number of optical fibers between microelectronic die 16 and microelectronic die 18 may be one or many depending on the number of high speed signals required between the two devices. Although two packages are shown on opto-electrical printed circuit board 10 for illustration purposes, any number of packages may reside on opto-electrical PCB 10 that use optical fiber interconnects between them and still be within the spirit and scope of the present invention. Further, opto-electrical printed circuit board 10 may contain other microelectronic dies/packages that interconnect to other microelectronic dies/packages with standard metal interconnects. These microelectronic dies may use metal interconnects for signals that don't require higher speeds.

Figure 2:
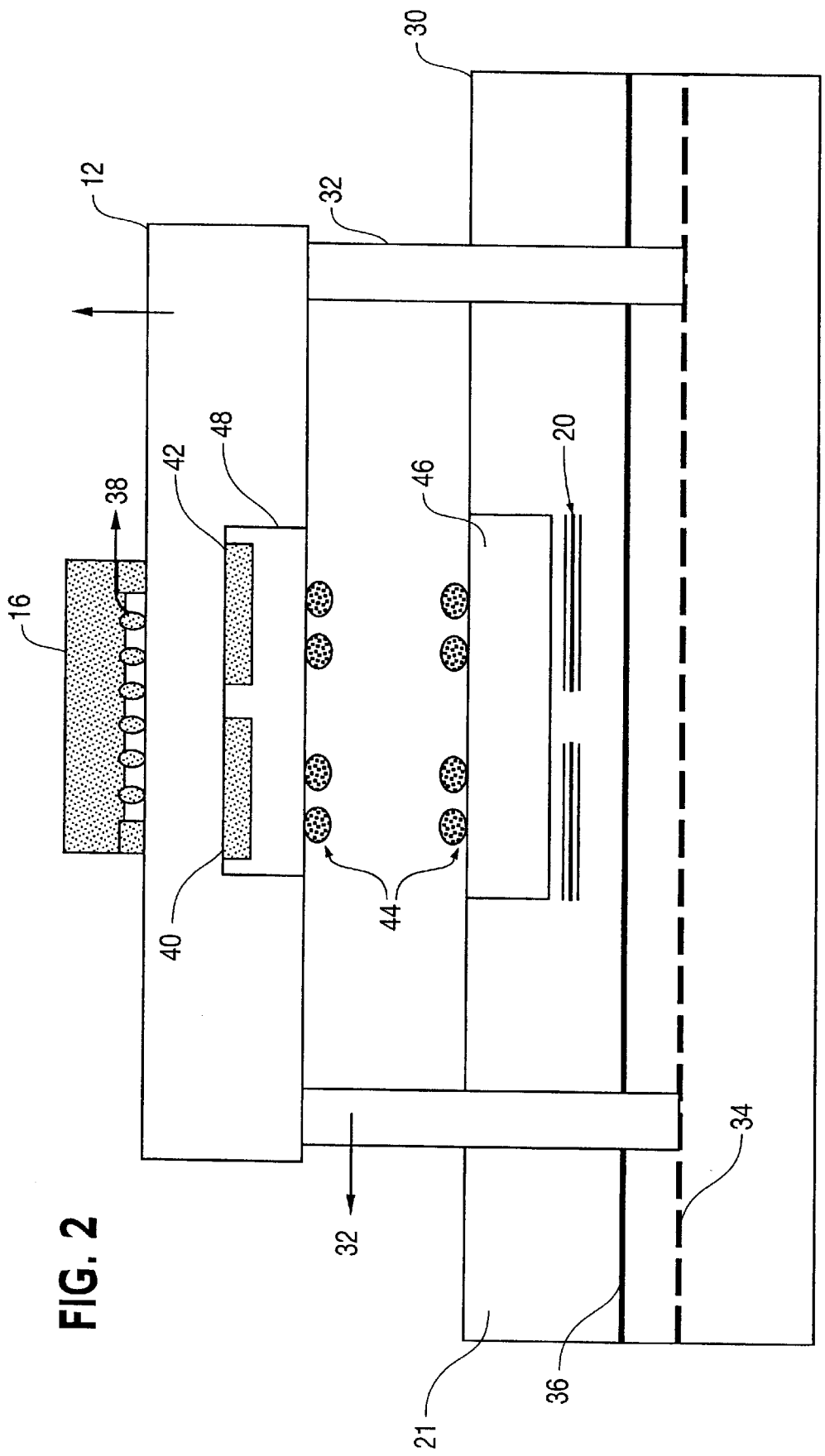
FIG. 2 is a side view diagram of an opto-electrical package on an opto-electrical printed circuit board according to an example embodiment of the present invention.

FIG. 2 shows a side view diagram of an opto-electrical package on an opto-electrical printed circuit board according to an example embodiment of the present invention. Opto-electrical package 12 may be attached to opto-electrical printed circuit board (PCB) 30. Power and ground conductors 32 of package 12 may also be attached to printed circuit board 30. These power and ground conductors may be in the form of pins or bars that are inserted into PCB 30 (as in this example embodiment) and electrically connected with either a power plane 36 or ground plane 34 embedded in a base material 21 of PCB 30. Package 12 may also be surface mounted onto to PCB 30, in which case power and ground conductors 32 may be electrically connected with power plane 36 or ground plane 34 by vias through PCB 30.

Microelectronic die 16 is housed in package 12 and may be attached to package 12 via C4 (controlled collapse chip connector) bumps 38. In this example embodiment, optical fibers 20 are embedded in the base material 21 of PCB 30. A transparent substrate 46 may be embedded in the base material 21 of PCB 30 over the top of optical fibers 20 underneath package 12. Opto-electrical package 12 includes an optical receiver 40 and optical transmitter 42 attached on the bottom side of package 12. Optical receiver 40 and optical transmitter 42 may be microelectronic dies electrically connected to microelectronic die 16 through package 12. An encapsulating polymer 48 may cover the optical receiver 40 and optical transmitter 42. Transparent substrate 46 in PCB 30 and encapsulating polymer 48 on the bottom side of package 12 both may have one or more microlens arrays 44 attached. Microlens array 44 helps focus light transferred between microelectronic die 16 through optical receiver 40 and optical transmitter 42 to the optical fibers 20 embedded in PCB 30. In this example embodiment, optical receiver 40 is shown as a photo detector array (PD array). Moreover, optical transmitter 42 is shown as a vertical cavity service emission laser array (VCSEL array). However, any optical receiver and optical transmitter may be used and still be within the spirit and scope of the present invention. Encapsulating polymer 48 prevents the optical receiver and optical transmitter microelectronic dies from being contaminated (e.g., from dust). Transparent substrate 46 helps to prevent light loss upon transmission between microelectronic die 16 and the optical fibers 20.

Figure 3:
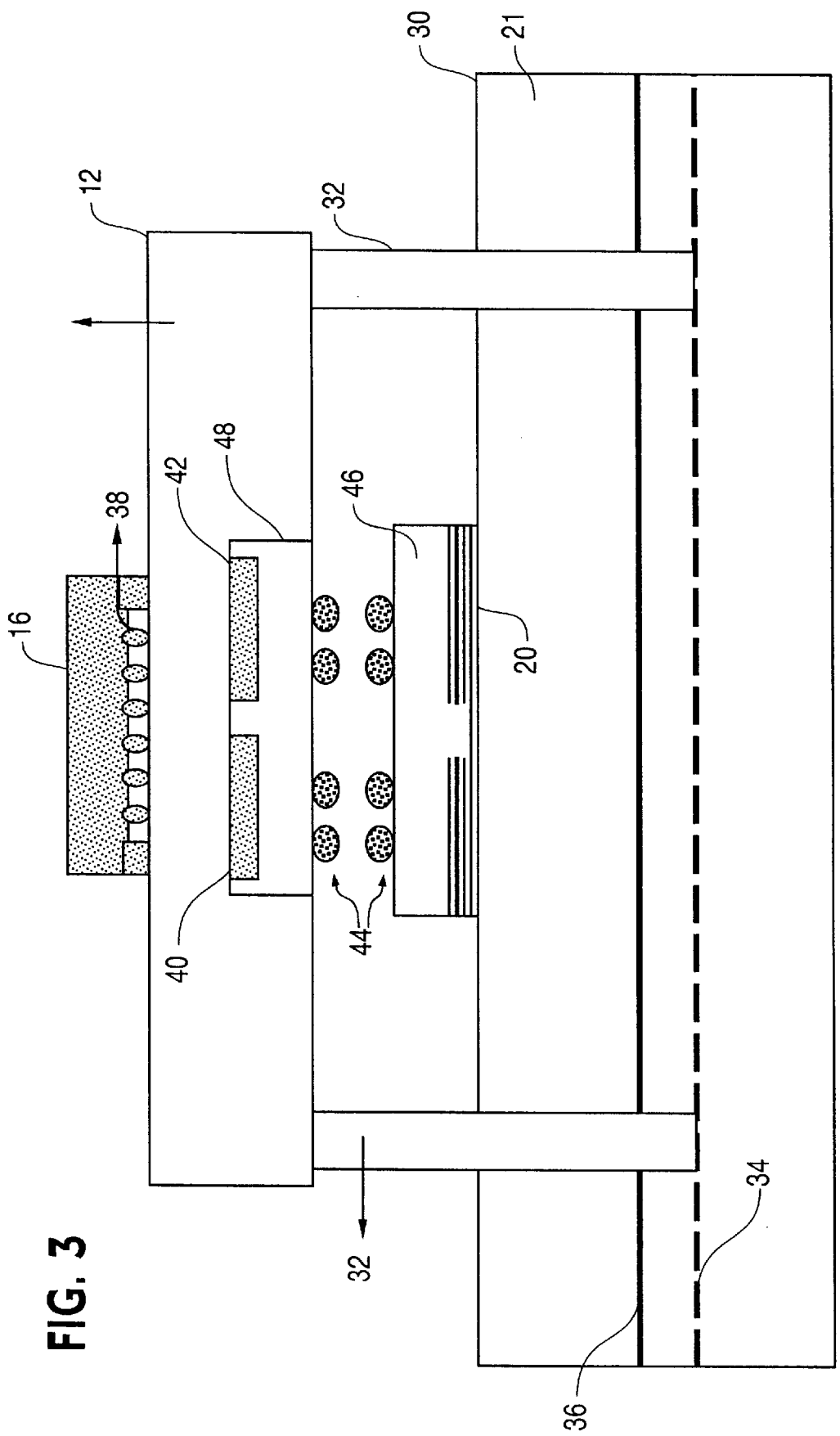
FIG. 3 is a side view diagram of an opto-electrical package on an opto-electrical printed circuit board according to a second embodiment of the present invention.

FIG. 3 shows a side view diagram of an opto-electrical package on an opto-electrical printed circuit board according to a second embodiment of the present invention. This embodiment is similar to that shown in FIG. 2 except that the optical fibers 20 now reside on the surface of a printed circuit board 40. The transparent substrate 46 still covers and protects optical fibers 20 and also includes microlens arrays 44, but now also resides on the surface of PCB 40. This embodiment may have the advantage of being easier to manufacture than the embodiment shown in FIG. 2, however, may add some risk since optical fibers 20 are now on the surface of PCB 40. Optical fibers on the surface of an opto-electrical printed circuit board may also provide an advantage of being easier to rework after manufacturing should some of the interconnections require changing.

Figure 4:
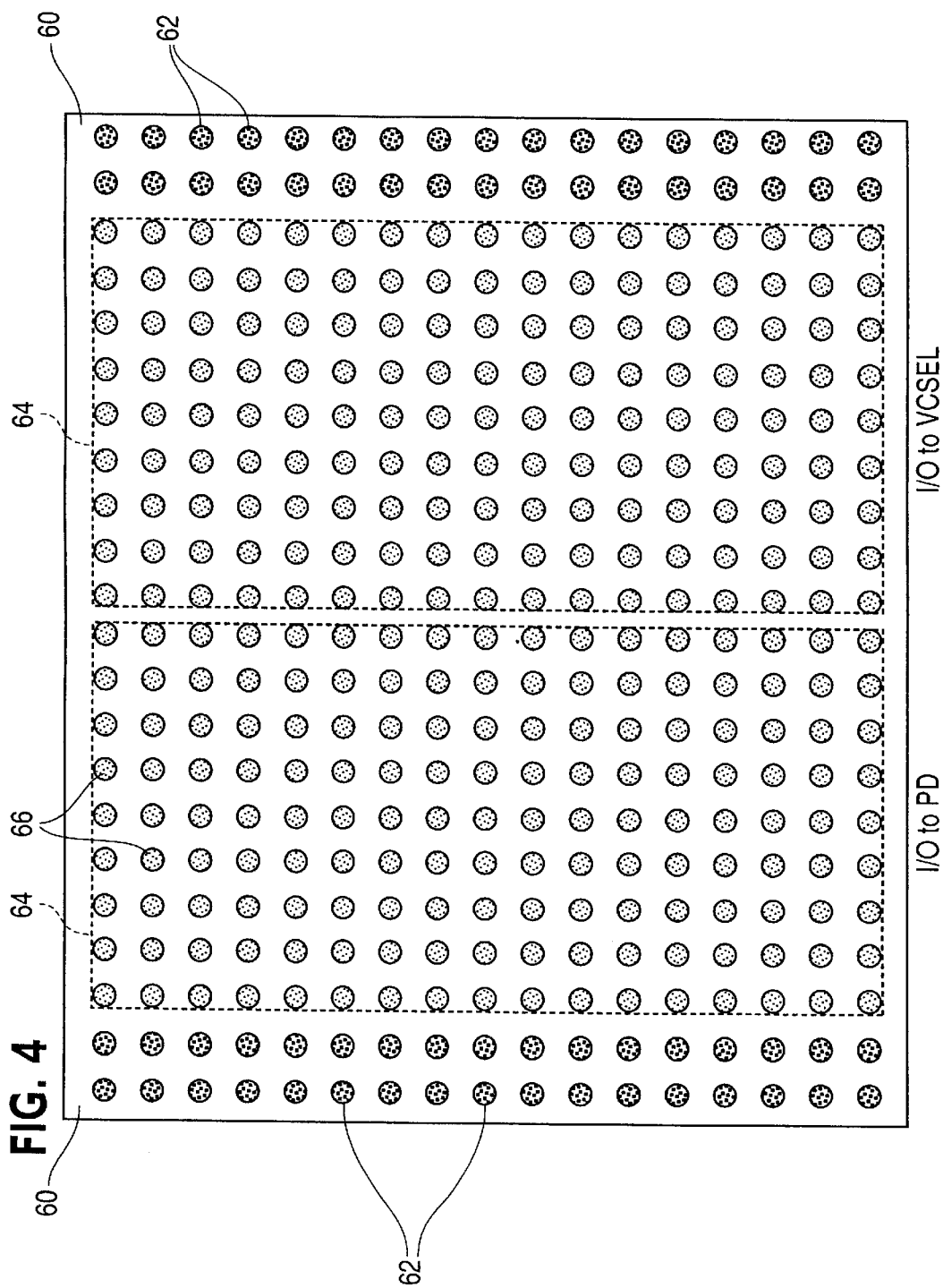
FIG. 4 is a bottom view of a microelectronic die with C4 bumps compatible with an opto-electrical package according to an example embodiment of the present invention.

FIG. 4 is a bottom view of a microelectronic die with C4 bumps compatible with an opto-electrical package according to an example embodiment of the present invention. The microelectronic die has two areas 60 for power and ground connections. The power and ground conductors 62 are pins in this example embodiment. The power and ground conductors 62 are preferably arranged in a checkerboard pattern with alternating power and ground pins, therefore, providing a lower inductance and resistance. The center areas 64 of the microelectronic die may contain C4 bumps for input/output (I/O) signals. These I/O signals are transferred through C4 bumps 66. Therefore, according to the present invention, power and ground conductors may be located on the perimeter of a microelectronic die, and I/O signal conductors located in the interior of the microelectronic die. As noted previously, this preferred arrangement provides the advantage of a lower inductance and resistance.

Figure 5:
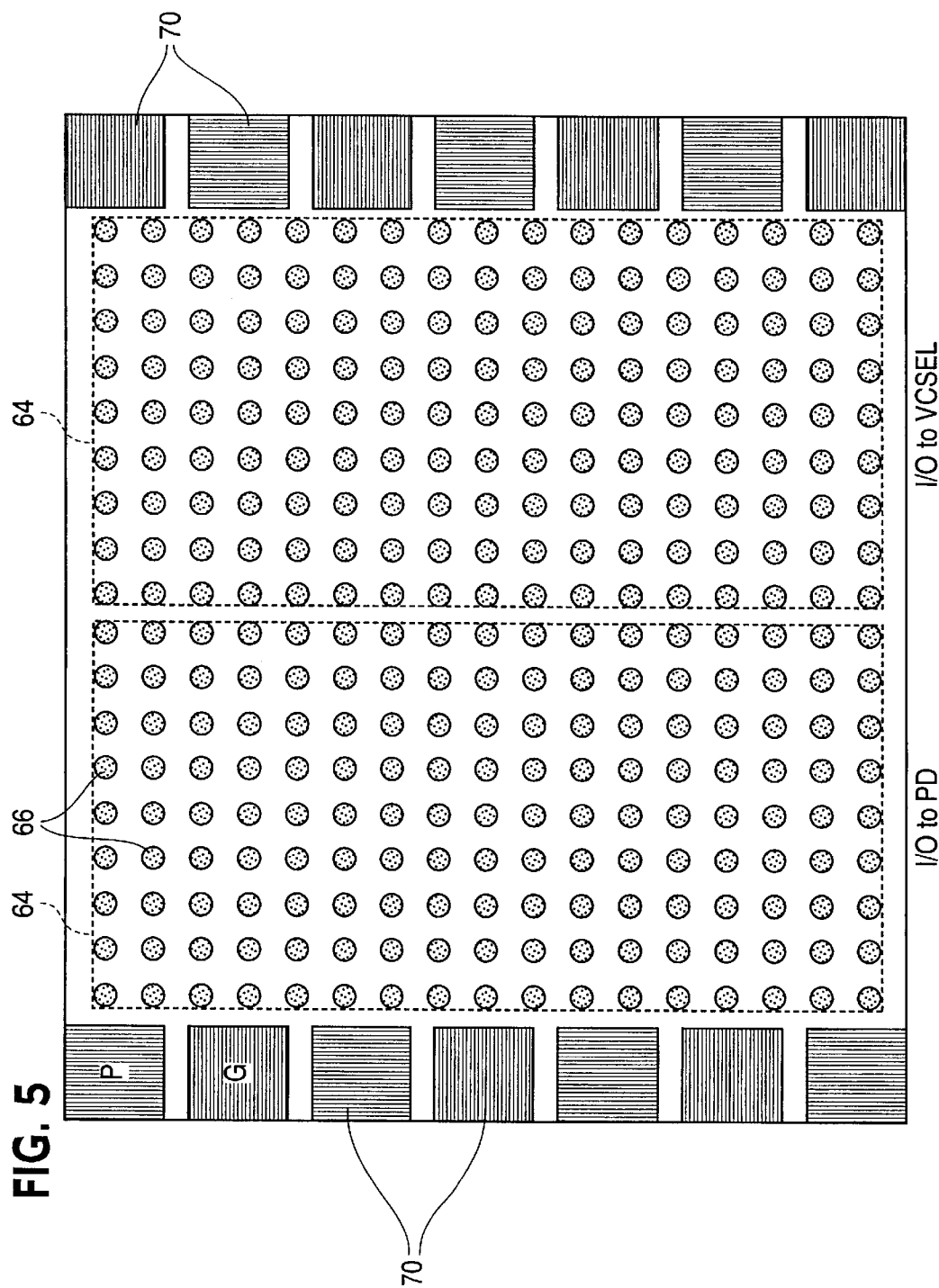
FIG. 5 is a bottom view of a microelectronic die with C4 bumps compatible with an opto-electrical package according to a second embodiment of the present invention.

FIG. 5 shows a bottom view of a microelectronic die with C4 bumps compatible with an opto-electrical package according to a second embodiment of the present invention. This embodiment may be used for high current applications. In this embodiment, the power and ground conductors are larger in size and may consist of pads that can carry higher current than standard pin conductors. Although the diagrams in FIGS. 4 and 5 are shown with power and ground conductors on two sides of the microelectronic die/package, the power and ground conductors may exist on all sides of the microelectronic die/package, or any subset of all sides and still be within the spirit and scope of the present invention. Moreover, although C4 connections are shown, the microelectronic die may be connected to the package via any type of connection, (e.g., surface mount, flat pack, etc.) and still be within the spirit and scope of the present invention.

FIGS. 4 and 5 represent preferred microelectronic die C4 layout embodiments. Microelectronic dies may exist with power and ground on pins in the interior of the microelectronic die or scattered throughout the pins of the microelectronic die. Microelectronic dies such as these may still be used in opto-electrical packages and opto-electrical printed circuit boards according to the present invention. For these type microelectronic dies, an opto-electrical package may be designed to route the power and ground connections from the interior of the microelectronic die to the perimeter of the package, and any I/O signals on the perimeter of the microelectronic die to the interior of the package. Therefore, signals from the microelectronic die can be transferred to and from an opto-electrical printed circuit board.

Therefore, according to the present invention, using optical interconnects on a printed circuit board avoids, high conduction and dielectric losses. This allows electronic devices (e.g., microelectronic dies) to operate at much faster speeds. Moreover, higher current capacity can be handled by the package due to location of power and ground connections on the perimeter of the package.

It is noted that the foregoing examples have been provided merely for the purpose of explanation and are in no way to be construed as limiting of the present invention. While the present invention has been described with reference to a preferred embodiment, it is understood that the words that have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. An opto-electrical printed circuit board (PCB) comprising:
   a base material;
   at least one optical fiber imbedded in the base material; and
   at least two transparent substrates imbedded in the base material,
   wherein the at least one optical fiber provides a high speed interconnect between at least two electronic devices attached to the PCB, the at least two electronic devices interfacing to the at least one optical fiber through the at least two transparent substrates.

2. The PCB according to claim 1, further comprising at least one micro-lens array attached to each at least two transparent substrates, each at least one micro-lens array focusing light signals transferred between the at least two electronic devices and the at least one optical fiber.

3. The PCB according to claim 1, further comprising a ground plane imbedded in the base material.

4. The PCB according to claim 1, further comprising a power plane imbedded in the base material.

5. The PCB according to claim 1, wherein at least one of the electronic devices comprises a processing unit.

6. The PCB according to claim 1, wherein at least one of the electronic devices comprises a controller.

7. The PCB according to claim 6, wherein the controller comprises at least one of an Input/Output controller and a memory controller.

8. The PCB according to claim 1, wherein at least one of the electronic devices comprises a connector.

9. An opto-electrical printed circuit board (PCB) comprising:
   a base material;
   at least one optical fiber on the surface of the base material; and
   at least two transparent substrates imbedded in the base material,
   wherein the at least one optical fiber provides a high speed interconnect between at least two electronic devices attached to the PCB, the at least two electronic devices interfacing to the at least one optical fiber through the at least two transparent substrates.

10. The PCB according to claim 9, further comprising at least one micro-lens array attached to each at least two transparent substrates, each at least one micro-lens array focusing light signals transferred between the at least two electronic devices and the at least one optical fiber.

11. The PCB according to claim 9, further comprising a ground plane imbedded in the base material.

12. The PCB according to claim 9, further comprising a power plane imbedded in the base material.

13. The PCB according to claim 9, wherein at least one of the electronic devices comprises a processing unit.

14. The PCB according to claim 9, wherein at least one of the electronic devices comprises a controller.

15. The PCB according to claim 14, wherein the controller comprises at least one of an Input/Output controller and a memory controller.

16. The PCB according to claim 9, wherein at least one of the electronic devices comprises a connector.

17. An opto-electrical package comprising:
   a base material, the base material having a top side and a bottom side, the top side having connection points for attaching an electronic component;
   at least one optical receiver attached to the bottom side of the base material;
   at least one optical transmitter attached to the bottom side of the base material;
   an encapsulating polymer, the encapsulating polymer embedded in the base material facing the bottom side and covering the at least one optical receiver and the at least one optical transmitter;
   at least one power connection point attached to the bottom side of the base material; and
   at least one ground connection point attached to the bottom side of the base material.

18. The package according to claim 17, wherein the at least one optical receiver comprises a photodetector.

19. The package according to claim 17, wherein the at least one optical transmitter comprises a vertical cavity service emission laser (VCSEL).

20. The package according to claim 17, wherein each at least one power connection point comprises one of a pin, a pad, and a bar.

21. The package according to claim 17, wherein each at least one ground connection point comprises one of a pin, a pad, and a bar.

22. The package according to claim 17, further comprising at least two microlens arrays attached to the encapsulating polymer, the at least two microlens arrays focusing optical signals being received by the at least one optical receiver and being transmitted by the at least one optical tranmitter.

* * * * *

UNITED STATES PATENT AND TRADEMARK OFFICE
CERTIFICATE OF CORRECTION

PATENT NO. : 6,599,031 B2
DATED : July 29, 2003
INVENTOR(S) : Yuan-Liang Li

It is certified that error appears in the above-identified patent and that said Letters Patent is hereby corrected as shown below:

Title page,
Item [56], References Cited, FOREIGN PATENT DOCUMENTS, delete "4/1994" and insert -- 7/1994 --

Signed and Sealed this

Twenty-seventh Day of July, 2004

JON W. DUDAS
*Acting Director of the United States Patent and Trademark Office*